United States Patent
Yamazaki et al.

(10) Patent No.: US 8,350,469 B2
(45) Date of Patent: *Jan. 8, 2013

(54) LIGHT EMITTING DEVICE HAVING ORGANIC COMPOUND

(75) Inventors: Shunpei Yamazaki, Tokyo (JP); Hideaki Kuwabara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/280,632

(22) Filed: Oct. 25, 2011

(65) Prior Publication Data

US 2012/0037899 A1 Feb. 16, 2012

Related U.S. Application Data (63) Continuation of application No. 12/689,433, filed on Jan. 19, 2010, now Pat. No. 8,049,421, which is a continuation of application No. 11/380,495, filed on Apr. 27, 2006, now Pat. No. 7,692,380, which is a continuation of application No. 10/406,564, filed on Apr. 4, 2003, now Pat. No. 7,038,374.

(30) Foreign Application Priority Data

Apr. 5, 2002 (JP) .................................. 2002-104194

(51) Int. Cl.
H01L 51/00 (2006.01)
(52) U.S. Cl. ........................................ 313/506; 313/504
(58) Field of Classification Search .................. 313/504, 313/506
See application file for complete search history.

(56) References Cited

U.S. PATENT DOCUMENTS

| 5,343,050 A | 8/1994 | Egusa et al. |
| 5,783,292 A | 7/1998 | Tokito et al. |
| 6,107,734 A | 8/2000 | Tanaka et al. |
| 6,337,492 B1 | 1/2002 | Jones et al. |

(Continued)

FOREIGN PATENT DOCUMENTS

EP 1191820 A1 3/2002

(Continued)

OTHER PUBLICATIONS

Baijun Chen et al.; "Fabrication of a Tris(8-hydroxyquinoline) Aluminum (Alq3)/Poly(N-vinylcarbazole) (PVK) Superlattice Structure and Its Use for Electroluminescent Device"; Japan Journal of Applied Physics, vol. 37, Part 1, No. 3B, pp. 1665-1666, Mar. 1998.

(Continued)

Primary Examiner — Karabi Guharay
(74) Attorney, Agent, or Firm — Fish & Richardson P.C.

(57) ABSTRACT

When a light emitting element is actuated to allow the light emission, the generation of Joule heat occurs, leading to the decomposition or crystallization of an organic compound to cause the degradation of the light emitting device. Therefore, a light emitting element of the present invention is provided for effecting removing or decreasing the generation of heat. In the present invention, between two electrodes, layers having organic compounds and carbon-based thin films are alternatively laminated one after another for stepping down the driving voltage in the light emitting element using the tunnel effect. In addition, a carbon-based thin film is placed on a film containing an organic compound, so that it prevents the electric field from being locally concentrated and also prevents the generation of short-circuit between the anode and the cathode.

20 Claims, 9 Drawing Sheets

U.S. PATENT DOCUMENTS

| | | |
|---|---|---|
| 6,538,374 B2 | 3/2003 | Hosokawa |
| 6,566,806 B1 | 5/2003 | Kawai |
| 6,872,472 B2 | 3/2005 | Liao et al. |
| 6,933,672 B2 | 8/2005 | Hosokawa |
| 7,038,374 B2 | 5/2006 | Yamazaki et al. |
| 7,692,380 B2 | 4/2010 | Yamazaki et al. |
| 8,049,421 B2 * | 11/2011 | Yamazaki et al. ............ 313/506 |
| 2002/0057051 A1 | 5/2002 | Kobayashi |
| 2002/0113546 A1 * | 8/2002 | Seo et al. .................... 313/504 |
| 2002/0153831 A1 | 10/2002 | Sakakura et al. |
| 2003/0127967 A1 | 7/2003 | Tsutsui et al. |
| 2003/0197465 A1 | 10/2003 | Qiu et al. |
| 2004/0102632 A1 | 5/2004 | Thompson et al. |
| 2005/0006642 A1 | 1/2005 | Tung et al. |
| 2005/0029933 A1 | 2/2005 | Liao et al. |
| 2005/0248266 A1 | 11/2005 | Hosokawa |
| 2006/0084347 A1 | 4/2006 | Tutt et al. |

FOREIGN PATENT DOCUMENTS

| | | |
|---|---|---|
| EP | 1339112 A2 | 8/2003 |
| JP | 11-031587 A | 2/1999 |
| JP | 11-224781 A | 8/1999 |
| JP | 11-329748 A | 11/1999 |
| JP | 11-329749 A | 11/1999 |
| JP | 2000-091626 A | 3/2000 |
| JP | 2001-230086 A | 8/2001 |
| JP | 2002-237388 A | 8/2002 |
| JP | 2003-045676 A | 2/2003 |
| JP | 2004-039617 A | 2/2004 |
| WO | WO 97/20355 A1 | 6/1997 |

OTHER PUBLICATIONS

Jingsong Huang et al.; "High-brightness organic double-quantum-well electroluminescent devices"; Applied Physics Letters, vol. 77, No. 12; pp. 1750-1752; Sep. 2000.

* cited by examiner

LIGHT EMITTING DEVICE HAVING ORGANIC COMPOUND

CROSS-REFERENCE TO RELATED APPLICATIONS

This application is a continuation of U.S. application Ser. No. 12/689,433, filed Jan. 19, 2010, now U.S. Pat. No. 8,049,421, which is a continuation of U.S. application Ser. No. 11/380,495, filed Apr. 27, 2006, now U.S. Pat. No. 7,692,380, which is a continuation of U.S. application Ser. No. 10/406,564, filed Apr. 4, 2003, now U.S. Pat. No. 7,038,374, which claims the benefit of a foreign priority application filed in Japan as Serial No. 2002-104194 on Apr. 5, 2002, all of which are incorporated by reference.

BACKGROUND OF THE INVENTION

1. Field of the Invention

The present invention relates to a light emitting apparatus using a light emitting element emitting fluorescence or phosphorescence by applying an electric field to an element having a film including an organic compound (hereinafter, described as "organic compound layer") between a pair of electrodes, and to a method of fabricating the light emitting apparatus. Further, a light emitting apparatus in the specification includes an image display device, a light emitting device or a light source (including illuminating device). Further, a light emitting apparatus includes all of a module of a light emitting apparatus attached with a connector, for example, FPC (Flexible Printed Circuit) or TAB (Tape Automated Bonding) tape or TCP (Tape Carrier Package), a module provided with a printed wiring board at a front end of TAB tape or TCP and a module in which a light emitting element is directly mounted with IC (Integrated Circuit) by COG (Chip On Glass) system.

2. Description of the Related Art

There is expected application of a light emitting element using an organic compound characterized in thin shape, light weight, high response and direct current voltage drive as a light emitting body to a flat panel display of next generation. Particularly, a display apparatus arranged with light emitting elements in a matrix-like shape seems to be superior to a liquid crystal display apparatus of a related art in view of wide viewing angle and excellence in optical recognizing performance.

According to the light emitting mechanism of a light emitting element, it is said that by interposing an organic compound layer between a pair of electrodes and applying voltage, an electron injected from a cathode and a hole injected from an anode are recombined at a center of light emission in the organic compound layer to form molecular exciton and when the molecular exciton returns to the ground state, energy is discharged to emit light. There are known singlet excitation and triplet excitation in an excited state and it seems that light can be emitted by way of either of the excited states.

It is possible to use driving methods of passive matrix drive (simple matrix type) and active matrix drive (active matrix type) for such a light emitting apparatus formed by arranging light emitting elements in a matrix-like shape. However, when a pixel density is increased, the active matrix type provided with a switch for each pixel (or dot) is advantageous since the active matrix type can be driven at low voltage.

Further, although a low molecular species material and a high molecular species (polymer species) material are respectively researched for an organic compound for constituting the organic compound layer (strictly speaking, light emitting layer) regarded to be the core of a light emitting element, more attention is given to the high molecular species material facilitated to handle and having high heat resistance than the low molecular species material.

Further, although there are known methods such as vapor deposition method, spin coating method and ink jet method for a film forming method of the organic compounds, as a method for realizing full color formation by using the high molecular species material, spin coating method and ink jet method are particularly well known.

The light emitting elements having the organic compounds has a defect that is easy to be deteriorated by various factors, therefore it is a maximum object of the light emitting elements to be formed with high reliability (long lifetime).

Here, in a light emitting element using an organic compound, we will consider the pathway in which an electron and a hole injected from an electrode are converted to photon and finally brought out to the outside of the element. Among the currents passing through an external circuit, only some fractions thereof contribute to the carrier combination as electron-hole pairs and part of the recombined electron-hole pairs is consumed in the generation of luminescent molecular excitons. The generated excitons are converted to photon as much as being defined by fluorescent quantum efficiency. The remainder thereof is deactivated in various pathways, for example thermal deactivation and the generation of infrared light. Therefore, when such a light emitting element is actuated to allow the light emission, the generation of Joule heat occurs, leading to the decomposition or crystallization of an organic compound to cause the degradation of the light emitting element.

SUMMARY OF THE INVENTION

Therefore, it is an object of the present invention to provide a light emitting element having an organic compound in which heat generation can be effectively removed or decreased.

The light emitting element of the present invention has a plurality of layers containing different organic compounds. A carbon-based thin film is formed between the adjacent layers to effectively remove or reduce the heat generated at the time of actuation.

In the present invention, the thickness of the carbon-based is very thin, for example about 2 nm, to allow an electron to pass through the carbon-based thin film (i.e., a potential barrier) by applying a minute voltage between the electrodes. That is, the light emitting element of the present invention that allows the tunnel injection may be one kind of tunnel elements. There are two different types of tunnel injections. One is a Fowler-Nordheim (FN) tunnel injection dominantly occurred with a large film thickness and a large electric field, and the other is a direct tunnel injection dominantly occurred with a film thickness of 3 to 4 nm or less. In the present invention, between two electrodes, layers having organic compounds and carbon-based thin films are alternatively laminated one after another for stepping down the driving voltage in the light emitting element using the tunnel effect.

Furthermore, the film that contains the organic compound is very thin, so that the thickness thereof may become uneven when foreign particles are mixed in the material before or at the time of the film formation. In this case, there is a possibility of causing the generation of heat as the electric field is locally concentrated. However, the concentration of the electric field and also the generation of short-circuit between the anode and the cathode can be prevented by providing a carbon-based thin film on the film containing an organic compound. In addition, even though the film containing the organic compound has an uneven thickness, the formation of such a carbon-based thin film prevents the generation of heat by the locally-concentrated electric filed and also prevents the organic film from being deteriorated, improving the reliability of the film containing the organic compound.

The carbon-based organic film is functioned as a barrier between the adjacent layers to prevent the different materials of these layers from being mixed at the time of the film formation. Also, such a film is also capable of protecting each of the light emitting layers by preventing their materials from being mixed together under the generation of heat at the time of actuating the light emitting element.

Furthermore, the carbon-based thin film has another function of protecting the organic film against impurities such as water and oxygen.

Figure 1A:
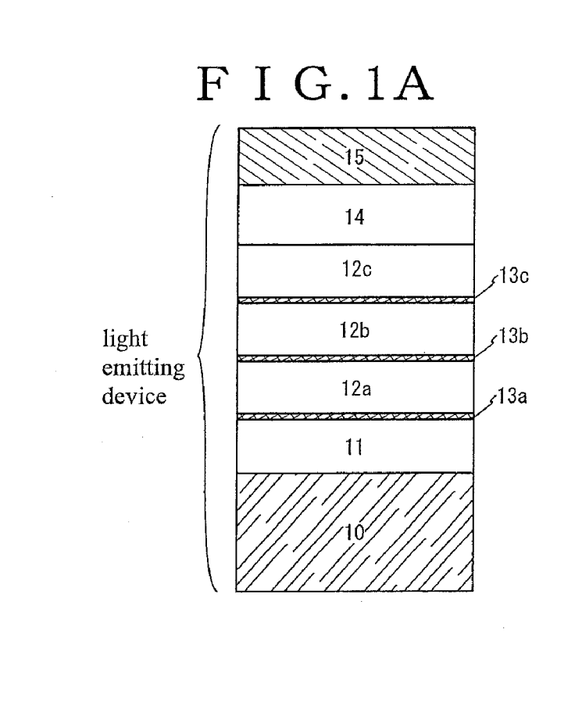
FIG. 1A is a schematic cross sectional view for illustrating the configuration of the light emitting element and FIG. 1B is schematic view for illustrating an energy gap structure of the light emitting element.
Figure 1B:
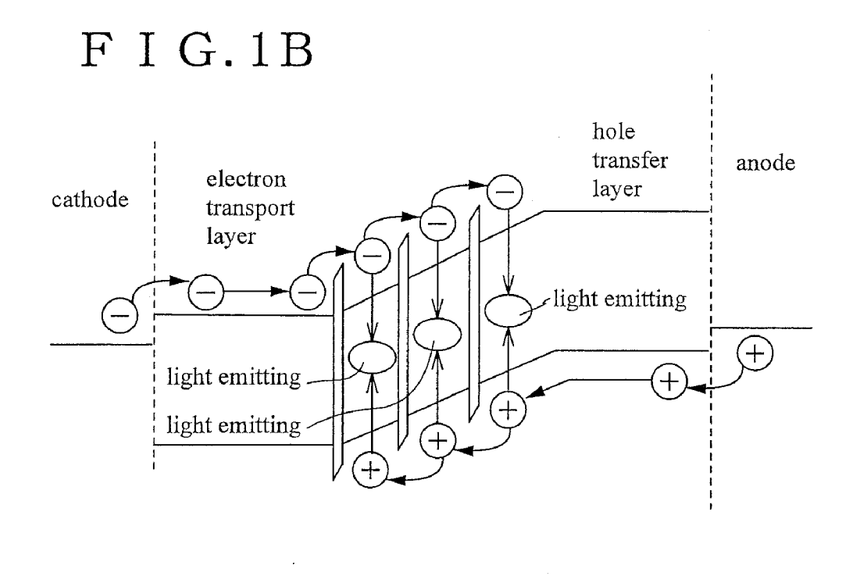

As illustrated in FIGS. 1A-B, a first aspect of the present invention is a light emitting device comprising a plurality of light emitting elements on a substrate having an insulating surface, wherein each of the light emitting elements comprises: a first electrode; a first layer containing an organic compound provided in contact with the top of the first electrode; a first carbon-based thin film formed on the first layer; a second layer containing an organic compound formed on the first thin film; a second carbon-based thin film on the second layer; a third layer containing an organic compound formed on the second thin film; a third carbon-based thin film on the third layer; a fourth layer containing an organic compound formed on the third thin layer; a fifth organic layer containing an organic compound formed on the fourth layer; and a second electrode provided in contact with the top of the fifth organic layer.

Figure 2A:
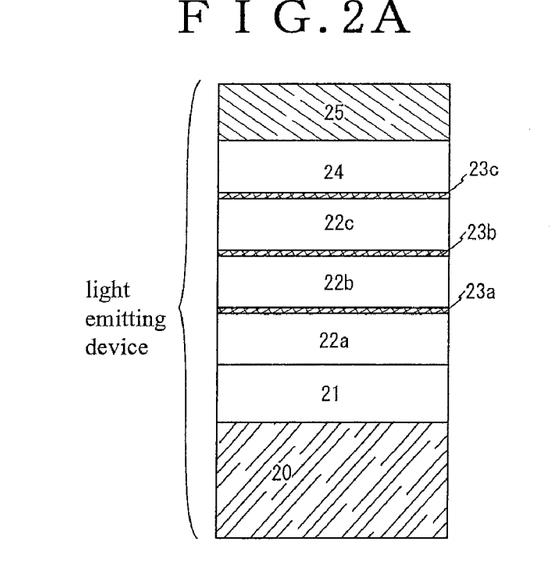
FIG. 2A is a schematic cross sectional view for illustrating the configuration of the light emitting element and FIG. 2B is schematic view for illustrating an energy gap structure of the light emitting element.
Figure 2B:
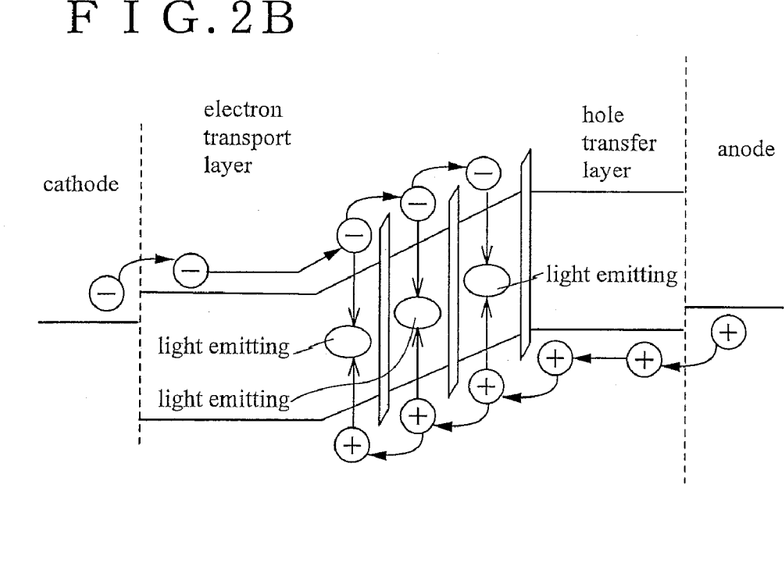

In addition, as illustrated in FIGS. 2A-B, a second aspect of the present invention is a light emitting device comprising a plurality of light emitting elements on a substrate having an insulating layer, wherein each of the light emitting elements comprises: a first electrode; a first layer containing an organic compound provided in contact with the top of the first electrode; a second layer containing an organic compound formed on the first layer; a first carbon-based thin film formed on the second layer; a third layer containing an organic compound formed on the first thin film; a second carbon-based thin film formed on the third layer; a fourth layer containing an organic compound formed on the second thin film; a third carbon-based thin film formed on the fourth layer; a fifth layer comprising the organic compound formed on the third thin film; and a second electrode provided in contact with the fifth layer.

Figure 3A:
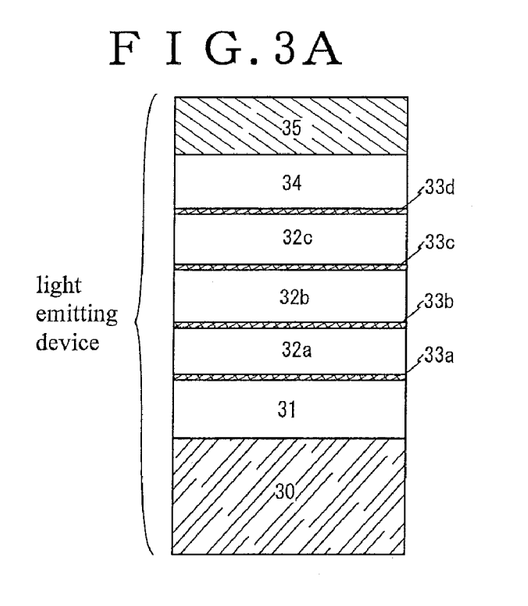
FIG. 3A is a schematic cross sectional view for illustrating the configuration of the light emitting element and FIG. 3B is schematic view for illustrating an energy gap structure of the light emitting element.
Figure 3B:
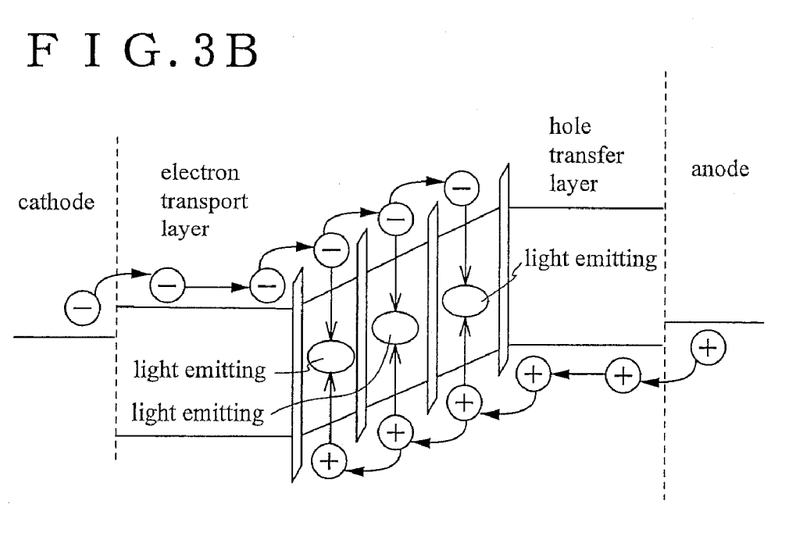

In addition, as illustrated in FIGS. 3A-B, a third aspect of the present invention is a light emitting device comprising a plurality of light emitting elements on a substrate having an insulating layer, wherein each of the light emitting elements comprises: a first electrode; a first layer containing an organic compound provided in contact with the top of the first electrode; a first carbon-based thin film formed on the first layer; a second layer containing an organic compound formed on the first thin film; a second carbon-based thin film formed on the second layer; a third layer containing an organic compound formed on the second thin film; a third carbon-based thin film formed on the third layer; a fourth layer containing an organic compound formed on the third thin film; a fourth carbon-based thin film formed on the fourth layer; a fifth layer containing an organic compound formed on the fourth thin film; and a second electrode provided in contact with the fifth layer.

Figure 4A:
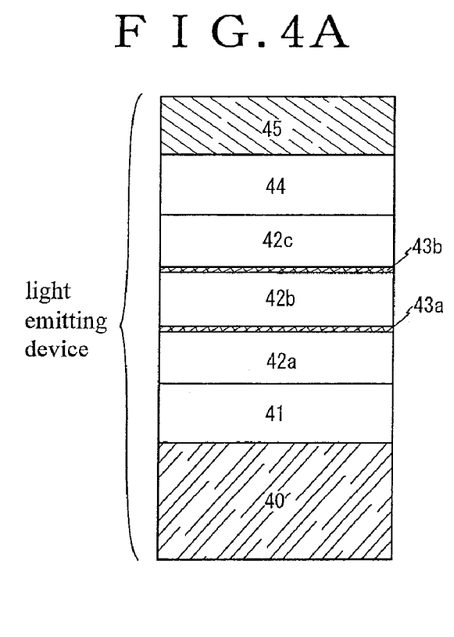
FIGS. 4A-B are diagrams for illustrating the configuration of a light emitting device in accordance with a fourth embodiment of the present invention, where
Figure 4B:
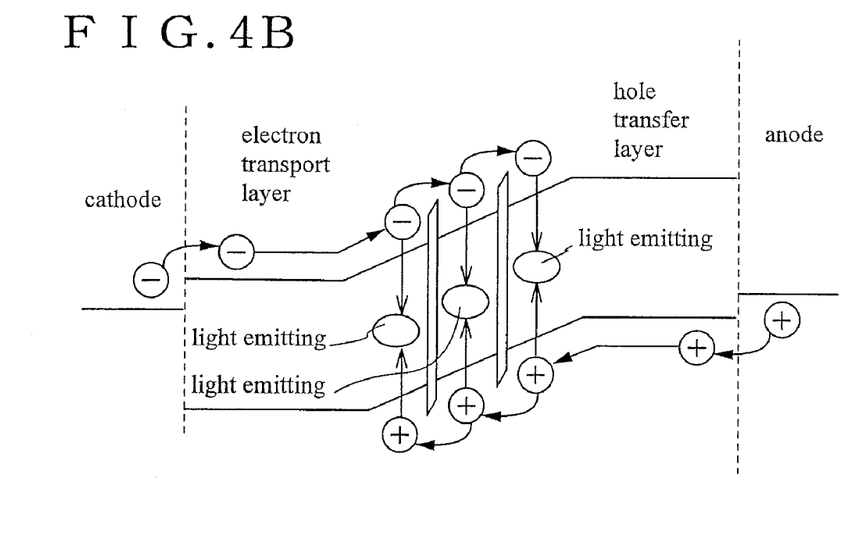

In addition, as illustrated in FIGS. 4A-B, a fourth aspect of the present invention is a light emitting device comprising a plurality of light emitting elements on a substrate having an insulating layer, wherein each of the light emitting elements comprises: a first electrode; a first layer containing an organic compound provided in contact with the top of the first electrode; a second layer containing an organic compound formed on the first layer; a first carbon-based thin film formed on the second layer; a third layer containing an organic compound formed on the first thin film; a second carbon-based thin film formed on the third layer; a fourth layer containing an organic compound formed on the second thin layer; a fifth layer containing an organic compound formed on the fourth layer; and a second electrode provided in contact with the fifth layer.

In each configuration of the above aspects of the present invention, the carbon-based thin film may be a diamond like carbon (DLC) film or an amorphous carbon film having a film thickness of 3 to 50 nm. The DLC film has a $sp^3$ hybrid bond as a C—C bond in short-distance order and also has an amorphous structure in macroscopic order. The composition of the DLC film contains 70 to 95 atomic percent of carbon and 5 to 30 atomic percent of hydrogen, and is very hard and is excellent in insulating properties. In addition, the DLC film is a thin film chemically stable and hardly changeable. Furthermore, the thermal conductivity of the DLC film is 200 to 600 W/m K, and the DLC film is capable of releasing heat generated at the time of driving. The DLC film is also characterized in that oxygen and hydrogen gas permeabilities are small. In addition, it is known that the DLC film has a hardness of 15 to 25 GPa by measurement using a microhardness meter.

The DLC film may be prepared using a plasma CVD method (typically, a RF plasma CVD method, a microwave CVD method, an electron cyclotron resonance (ECR) CVD method, a hot-filament CVD method, or the like), a combustion method, a sputtering method, an ion beam deposition method, a laser deposition method, or the like. Each of these film-forming methods allows the formation of a DLC film with a good adhesiveness. The formation of the DLC film is performed by placing a substrate on a cathode, or by applying a negative bias and utilizing ion bombardment to some extent to obtain a closely packed and hardened film.

Reactive gases to be used for the film formation are a hydrogen gas and a hydrocarbon gas (e.g., $CH_4$, $C_2H_2$, and $C_6H_6$). The film formation is performed by ionizing the reactive gas with glow discharge and bombarding ions on the cathode being subjected to negative self-bias. Consequently, a closely packed and smooth DLC film can be obtained. Furthermore, the DLC film is an insulating film which is transparent or translucent to visible light. In this specification, the term "transparent to visible light" means a visible light transmittance of 80 to 100%, and the term "translucent to visible light" means a visible light transmittance of 50 to 80%.

Furthermore, in the present invention, for forming a thin film principally containing carbon atoms (also referred to as a carbon-based thin film) in contact with a film containing an organic compound, it is important to prevent a film containing an organic compound from being damaged by plasma or the like at the time of film formation.

Preferably, the method of film formation with a little damage is properly selected from representative methods such as a microwave CVD method, an electron cyclotron resonance (ECR) CVD method, a hot-filament CVD method, a helicon wave plasma method, and a combustion method.

For instance, the film formation is performed by introducing radicals into a film-forming chamber without generating radicals in the film-forming chamber to reduce damage to be caused by the plasma. Specifically, a μ wave is generated by a microwave generator and the generated μ wave of about 2.45

GHz is transmitted to a plasma discharge tube after passing through a waveguide. In the plasma discharge tube, material gas is fed from a gas feeding pipe. Subsequently, in the plasma discharge tube, the material gas is decomposed by the radiation of micro waves to generate radicals. The radicals pass through the gas feeding pipe, followed by introducing in a film-forming chamber connected through a gate valve. Consequently, the generation of radicals is not occurred in the film-forming chamber, so that the damage to be caused by plasma can be reduced.

Furthermore, in the method of forming a carbon-based thin film, when the plasma CVD method is used, it is preferable to reduce the damage to be caused by plasma by making the frequency smaller, without limiting to a frequency (13.56 MHz) of a high frequency power source.

Furthermore, in the light emitting device, the outside light (the light outside from the light emitting device) incident on a pixel without emitting light is reflected from the back face (the surface on the side in contact with the light emitting layer). Therefore, there is a problem that the outside scenery is reflected on the observation surface (the surface facing to the observer) as the back face is acted as a mirror. In addition, for avoiding such a problem, the light emitting device is designed such that a circularly polarized film is attached on the observation surface of the light emitting device to prevent the reflection of outside scenery on the observation surface. However, such a circularly polarized film is very expensive, leading to another problem of increasing the manufacturing costs.

Therefore, in each aspect of the present invention, a light emitting device may be characterized in that the second layer containing the organic compound, the third layer containing the organic compound, or the fourth layer containing the organic compound is formed of a material that emits white light, and is combined with a color filter, or may be characterized in that the second layer comprising the organic compound, the third layer comprising an organic compound, or the fourth layer comprising an organic compound is formed of a material that emits monochromatic light, and is combined of a color-changing layer or a coloring layer.

Furthermore, a light emitting element (an EL element) comprises a layer containing an organic compound by which luminescence (electro luminescence) is generated by applying an electric field on the EL element (hereinafter, referred to as an EL layer), an anode, and a cathode. In general, the luminescence from organic compound may be luminescence (fluorescence) generated at the time of shifting from an excited single state to a ground state or luminescence (phosphorescence) at the time of returning to a ground state from an excited triplet state. The light emitting device to be manufactured by the present invention can be applied to both types of the luminescence.

Furthermore, the EL layer is provided as a laminated structure. Typically, mention may be made of a laminated structure of a hole transfer layer/a light emitting layer/an electron transport layer laminated on an anode in that order. This structure has a high luminous efficacy, and presently it has been adapted to most of the light emitting devices under investigated and developed.

Alternatively, the laminated layer may be designed as a structure having a hole injection layer/a hole transfer layer/a light emitting layer/an electron transport layer laminated on an anode in that order, or a structure of a hole injection layer/a hole transfer layer/a light emitting layer/an electron transport layer/an electron injection layer laminated on an anode in that order. In addition, fluorescent dye or the like may be doped in the light emitting layer. Also, the light emitting layer may be one having a hole transfer property or one having an electron transfer property. Furthermore, all of these layers may be prepared using low molecular weight materials or all of them may be prepared using high molecular weight materials. In the present specification, all layers arranged between the cathode and the anode are collectively referred to as layers containing organic compounds (EL layers). Therefore, the EL layers include the hole injection layer, the hole transfer layer, the light emitting layer, the electron transport layer, and the electron injection layer. In addition, the layer containing the organic compound (the EL layer) may contain an inorganic material such as silicon.

In the light emitting device of the present invention, a driving method for displaying an image on a screen is not specifically limited. For example, a dot sequential driving method or a line sequential driving method may be used. Typically, the line sequential type is used, and also a time division gradation driving method or an area gradation driving method may be properly used. Furthermore, a picture signal to be entered in a source line of the light emitting device may be an analog signal or a digital signal, so that a driving circuit or the like may be properly designed based on the picture signal.

In stead of the carbon-based thin film in each aspect of the present invention described above, a conductive thin film made of an organic material or an inorganic material-containing conductive thin film made of an organic material. The typical conductive thin film made of the organic material may be one prepared by applying a poly(ethylenedioxythiophene)/poly(styrenesulfonate) solution (PEDOT/PSS) on the whole surface followed by baking.

Furthermore, a fifth aspect of the present invention is a light emitting device comprising a plurality of light emitting elements on a substrate having an insulating layer, wherein each of the light emitting elements comprises: a first electrode; a first layer containing an organic compound provided in contact with the top of the first electrode; a first conductive thin film made of an organic material; a second layer comprising an organic compound on the first conductive thin film; a second conductive thin film made of an organic material; a third layer comprising an organic compound; a third conductive thin film made of an organic material; a fourth layer comprising an organic compound on the third conductive thin film; a fifth layer comprising an organic compound on the fourth layer; and a second electrode provided in contact with the fifth layer.

Furthermore, in the fifth aspect of the present invention, the conductive thin film made of the organic material is a poly (ethylenedioxythiophene) (PEDOT).

BRIEF DESCRIPTION OF THE DRAWINGS

FIGS. 1A-B are diagrams for illustrating the configuration of a light emitting device as a first embodiment of the present invention, where

FIGS. 2A-B are diagrams for illustrating the configuration of a light emitting device as a second embodiment of the present invention, where

FIGS. 3A-B are diagrams for illustrating the configuration of a light emitting device as a third embodiment of the present invention, where

FIG. 3B is schematic view for illustrating an energy gap structure of the light emitting element and FIG. 3A is a schematic cross sectional view for illustrating the configuration of the light emitting element;

FIGS. 5A-C are schematic diagrams for illustrating the case of irradiating light in full color using white illumination in the light emitting element of the first embodiment, where FIGS. 5A, 5B, and 5C show different methods for changing colors, respectively;

FIGS. 6A-B are diagrams for illustrating the configuration of the light emitting element of the first embodiment, where

FIGS. 7A-C are is diagrams for illustrating a pixel portion of the light emitting element of the first embodiment, where

DETAILED DESCRIPTION OF THE PREFERRED EMBODIMENTS

Hereinafter, we will describe preferred embodiments of the present invention with reference to the attached drawings.

Embodiment 1

FIG. 1A shows a light emitting element as one of preferred embodiments of the present invention. FIG. 1B shows a schematic illustration of an energy gap structure corresponding to FIG. 1A. However, FIG. 1B is only provided for exemplification, so that the configuration of the energy gap structure is not particularly limited to one shown in FIG. 1B.

The laminate structure shown in FIG. 1A is prepared by laminating a hole transfer layer 11, a DLC film 13a, a light emitting layer 12a, a DLC film 13b, a light emitting layer 12b, a DLC film 13c, a light emitting layer 12c, an electron transfer layer 14, and a negative electrode 15 on an anode 10 in that order. In this case, each of the DLC films 13a-13c is provided among the adjacent light emitting layers 12a-12c or between the light emitting layer 12a and the hole transfer layer 11, so that the concentration of electric field can be prevented and also short-circuit between an anode 10 and a cathode 15 can be prevented. In addition, even though the film has an uneven film thickness, the generation of heat to be caused by the local concentration of the electric field can be prevented by providing the DLC films 13a-13c, so that the film can be prevented from deterioration to improve the reliability of the resulting product.

The above DLC films 13a-13c have effects of blocking the layers 12a, 12b containing organic compounds from above and below against oxygen and water.

In addition, the materials and the film thicknesses of these layers to be sandwiched between the cathode and the anode may be designed properly to obtain red, green, and blue light emitting elements, respectively. A pair of electron and hole is injected into the light emitting layers sandwiched among the DLC films 13a-13c by the tunnel effect as shown in FIG. 1B to allow these layers to emit light.

Furthermore, it is possible to obtain while luminescence by properly selecting the materials of the respective light emitting layers 12a-12c and placing the layers 12a-12c on top of one another to mix the colors of these layers 12a-12c.

For obtaining white luminescence, there are various kinds of methods known in the art. Here, we will describe a case of using a light emitting layer made of a high polymer material, which can be formed by coating. In this case, the doping of pigments into the high polymer material to be formed into the light emitting layer may be performed by the conditioning of the solution. In other words, it can be attained extremely easily, compared with an evaporation method that performs a co-deposition for doping a plurality of pigments.

More specifically, a poly(ethylenedioxythiophene)/poly(styrenesulfonic acid) aqueous solution (PEDOT/PSS) to be acted as a hole-injecting layer 11 is applied on the whole surface of an anode 10 made of a metal (e.g., Pt, Cr, W, Ni, Zn, Sn, or In) and having a large work function and is then baked under vacuum heating, followed by the formation of the DLC film 13a.

Next, a polyvinylcarbazole (PVK) solution doped with luminescence center pigments (e.g., 1,4,4-tetraphenyl-1,3-butadiene (TPB), 4-didicyanomethylene-2-methyl-6-(p-dimethylamino-styryl)-4H-pyrane (DCM1), Nile Red, or coumarin 6) to be acted as a light emitting layer 12a is applied on the whole surface of the DLC film and is than baked under vacuum heating, followed by the formation of the DLC film 13b.

Furthermore, using the same materials and procedures as those described above, the light emitting layer 12b and the DCL film 13c are additionally formed and placed on top of each other, followed by forming the light emitting layer 12c made of the same material. When the DLC film is formed on an undesired area (e.g., a terminal portion), it can be selectively removed by an oxygen plasma treatment.

Subsequently, the formation of an electron transport layer 14 is performed. The electron transport layer 14 may be a metal complex having a quinoline skeleton, a metal complex having a benzoquinoline skeleton, an oxadiazole derivative, a tridiazole derivative, or a phenanthroline derivative.

Next, a cathode 15 is formed. The cathode 15 consists of a laminate structure made up of: a thin film containing a laminate structure of a metal (e.g., Li, Mg, or Cs) having a small work function; and a transparent conductive film (made of an indium tin oxide (ITO) alloy, an indium zinc oxide alloy ($In_2O_3$—ZnO), zinc oxide (ZnO), or the like) on the thin film.

Furthermore, in the above example, the light emitting layer is constructed of three layers as shown in FIG. 1A. Alternatively, it may be constructed of two layers or a single layer.

Furthermore, the organic compound film and the DLC film being laminated are formed between the anode and the cathode. A hole injected from the anode and an electron injected from the cathode are recombined together in the organic compound film, resulting in white luminescence.

A color filter may be arranged along the direction of emitting white luminescence from the above organic compound film. The color filter has a pigmented layer (R) that absorbs luminescence except red luminescence, a pigmented layer (G) that absorbs luminescence except green luminescence, and a pigmented layer (B) that absorbs luminescence except blue luminescence. Therefore, white luminescence from the light emitting element can be separated into different colors, so that red, green, and blue luminescence can be obtained. In the case of an active matrix type light emitting device, a thin-film transistor (TFT) is formed between the substrate and the color filter.

Furthermore, the pigmented layers (R, G, B) may have a stripe pattern, which is a most simple pattern, or may be selected from a diagonal mosaic arrangement, a trigonal pattern, a RGBG four-pixel arrangement, a RGBW four-pixel arrangement, and so on.

The pigmented layers that form the color filter are prepared using color resists formed of organic photosensitive material in which pigments are dispersed, respectively. By the way, the chromaticity coordinate of the white luminescence is (x, y)= (0.34, 0.35).

In this case, furthermore, even though the resulting luminescence color is different, there is no need to form the organic compound films by independently coating them every luminescence color because all of them are prepared from the organic compound film that represents white luminescence. In addition, a circular polarizing plate for preventing a minor reflection is not particularly required.

Figure 5A:
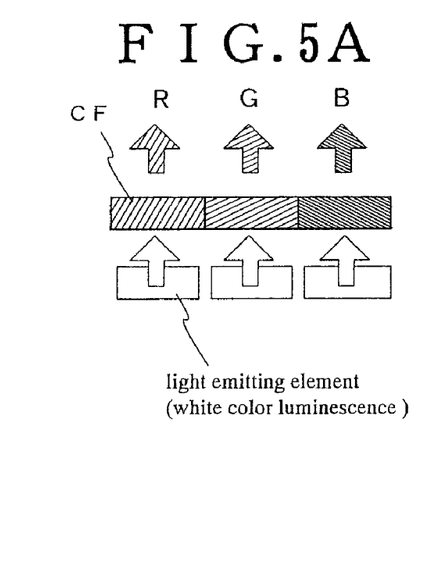
Figure 5B:
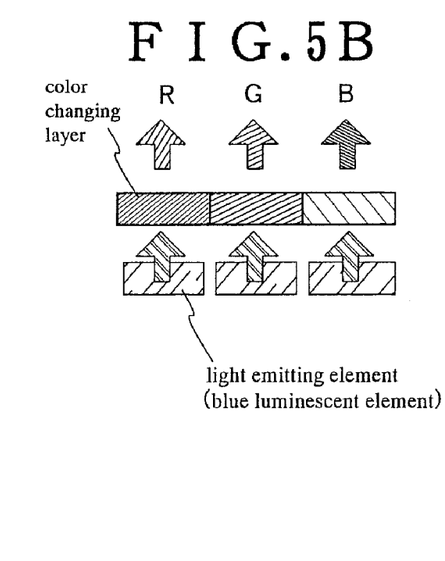

Next, we will describe a color changing medium (CCM) method which can be realized by combining a blue light emitting element having a blue-luminescent organic compound film and a fluorescent color-changing layer with reference to FIG. 5B.

The CCM method performs a color change with each color-changing layer by exciting the fluorescent color-changing layer with blue luminescence radiated from the blue light emitting element. Concretely, the color-changing layer performs the change from blue to red (B→R), the color-changing layer performs the change from blue to green (B→G), and the color-changing layer performs the change from blue to blue (B→B) (the change from blue to blue may be omitted) to obtain red, green, and blue light emission, respectively. In the case of the CCM method, the structure having TFT between the substrate and the color-changing layer is provided in an active matrix type light emitting layer.

In this case, also, there is no need to form the organic compound films by coating independently. In addition, a circular polarizing plate for preventing a mirror reflection is not particularly required.

Figure 5C:
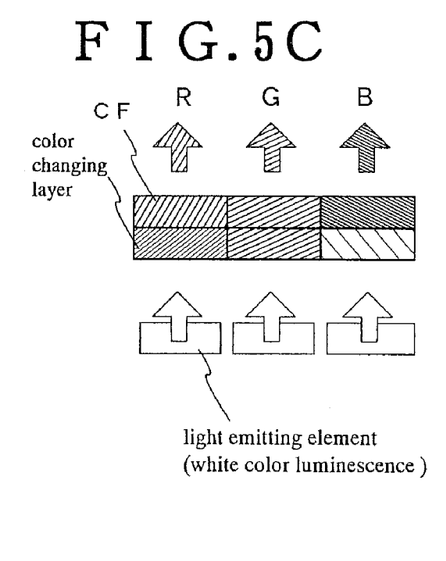

Furthermore, in the case of using the CCM method, the color-changing layer is fluorescent, so that it can be excited by outside light, causing a decrease in contrast. Therefore, it is preferable to increase the contrast by attaching a color filter or the like as shown in FIG. 5C.

Embodiment 2

In this embodiment, a light emitting element having a laminate structure which different from the above embodiment 1 is illustrated in FIGS. 2A-B. In addition, FIG. 2B shows a schematic illustration of an energy gap structure corresponding to FIG. 2A. However, FIG. 2B is only provided for exemplification, so that the configuration of the energy gap structure is not particularly limited to one shown in FIG. 2B.

The laminated structure shown in FIG. 2A is prepared by laminating a hole transfer layer 21, a light emitting layer 22$a$, a DLC film 23$a$, a light emitting layer 22$b$, a DLC film 23$b$, a light emitting layer 22$c$, a DLC film 23$c$, an electron transport layer 24, and a cathode 25 on a anode 20 in that order. In this case, each of the DLC films 23$a$-23$c$ is provided among the adjacent light emitting layers 22$a$-22$c$ or between the light emitting layer 22$d$ and the electron transfer layer 23$c$, so that the concentration of electric field can be prevented and also short-circuit between an anode 20 and a cathode 25 can be prevented. In addition, even though the film has an uneven film thickness, the generation of heat to be caused by the local concentration of the electric field can be prevented by providing the DL films 23$a$-23$c$, so that the film can be prevented from deterioration to improve the reliability of the resulting product.

In addition, the materials and the film thicknesses of these layers to be sandwiched between the cathode and the anode may be designed properly to obtain red, green, and blue light emitting elements. A pair of electron and hole is injected into the light emitting layers sandwiched among the DLC films 23$a$-23$c$ by the tunnel effect as shown in FIG. 2B to allow these layers to emit light.

Furthermore, it is possible to obtain while luminescence by properly selecting the materials of the respective light emitting layers 22$a$-22$c$ and placing the layers 22$a$-22$c$ on top of one another to mix the colors of these layers 22$a$-22$c$.

Embodiment 3

In this embodiment, a light emitting element having a laminate structure which different from the above embodiment 1 is illustrated in FIGS. 3A-B. In addition, FIG. 3B shows a schematic illustration of an energy gap structure corresponding to FIG. 3A. However, FIG. 3B is only provided for exemplification, so that the configuration of the energy gap structure is not particularly limited to one shown in FIG. 3B.

The laminated structure shown in FIG. 3A is prepared by laminating a hole transfer layer 31, a DLC film 33$a$, a light emitting layer 32$a$, a DLC film 33$b$, a light emitting layer 32$b$, a DLC film 33$c$, a light emitting layer 32$c$, a DLC film 33$d$, an electron transport layer 34, and a cathode 35 on an anode 30 in that order.

In this case, each of the DLC films 33$a$-33$d$ is provided among the adjacent light emitting layers 32$a$-32$c$ or between the light emitting layer 32$a$ and the hole transfer layer 31 or between the light emitting layer 32$c$ and the electron transfer layer 34, so that the concentration of electric field can be prevented and also short-circuit between an anode 30 and a cathode 35 can be prevented. In addition, even though the film has an uneven film thickness, the generation of heat to be caused by the local concentration of the electric field can be prevented by providing the DLC films 33$a$-33$d$, so that the film can be prevented from deterioration to improve the reliability of the resulting product.

In addition, the materials and the film thicknesses of these layers to be sandwiched between the cathode and the anode may be designed properly to obtain red, green, and blue light emitting elements, respectively. A pair of electron and hole is injected into the light emitting layers sandwiched among the DLC films 33$a$-33$d$ by the tunnel effect as shown in FIG. 3B to allow these layers to emit light.

Furthermore, it is possible to obtain while luminescence by properly selecting the materials of the respective light emitting layers 32$a$-32$c$ and placing the layers 32$a$-32$c$ on top of one another to mix the colors of these layers 32$a$-32$c$.

Embodiment 4

In this embodiment, a light emitting element having a laminate structure which different from the above embodiment 1 is illustrated in FIGS. 4A-B. In addition, FIG. 4B shows a schematic illustration of an energy gap structure corresponding to FIG. 4A. However, FIG. 4B is only provided for exemplification, so that the configuration of the energy gap structure is not particularly limited to one shown in FIG. 4B.

The laminated structure shown in FIG. 4A is prepared by laminating a hole transfer layer 41, a light emitting layer 42a, a DLC film 43a, a light emitting layer 42b, a DLC film 43b, a light emitting layer 42c, an electron transport layer 44, and a cathode 45 on an anode 40 in that order.

In this case, each of the DLC films 43a and 43b is provided among the adjacent light emitting layers 42a-42c, so that the concentration of electric field can be prevented and also short-circuit between an anode 40 and a cathode 45 can be prevented. In addition, even though the film has an uneven film thickness, the generation of heat to be caused by the local concentration of the electric field can be prevented by providing the DLC films 43a and 43b, so that the film can be prevented from deterioration to improve the reliability of the resulting product.

In addition, the materials and the film thicknesses of these layers to be sandwiched between the cathode and the anode may be designed properly to obtain red, green, and blue light emitting elements, respectively. A pair of electron and hole is injected into the light emitting layers sandwiched between the DLC films 43a, 43b by the tunnel effect as shown in FIG. 4B to allow these layers to emit light.

Furthermore, it is possible to obtain while luminescence by properly selecting the materials of the respective light emitting layers 42a-42c and placing the layers 42a-42c on top of one another to mix the colors of these layers 42a-42c.

Now, the above configuration of the present invention will be described in detail with the following examples.

EXAMPLES

Example 1

Figure 7A:
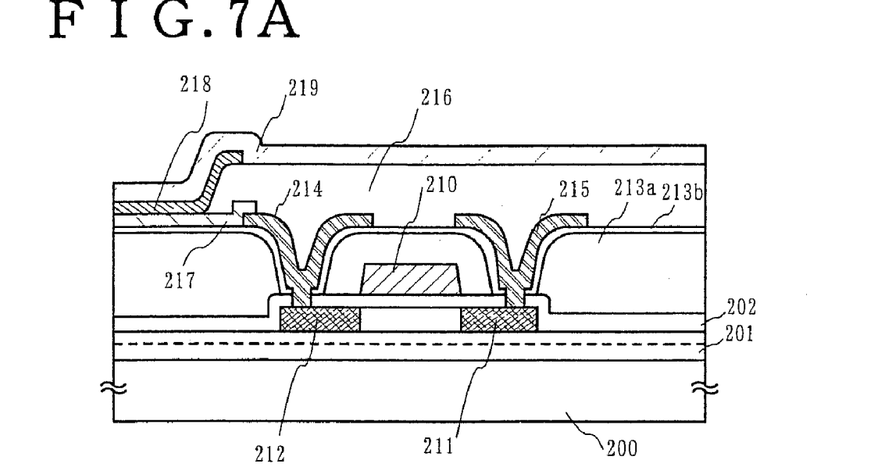
FIG. 7A and FIG. 7B are cross sectional views.
Figure 7B:
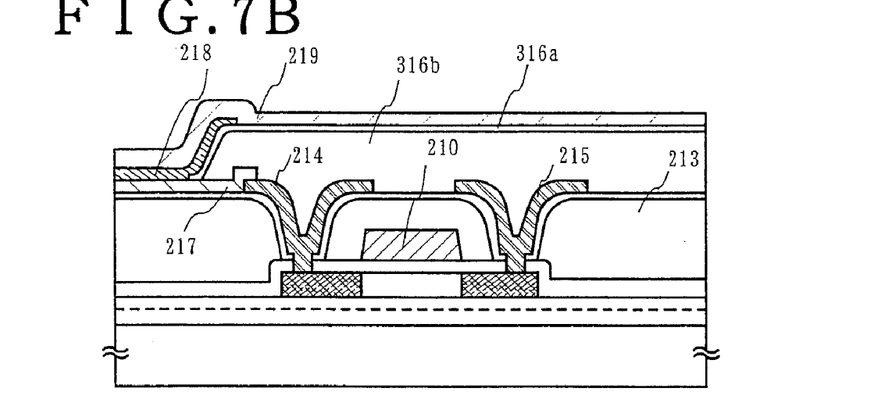
Figure 7C:
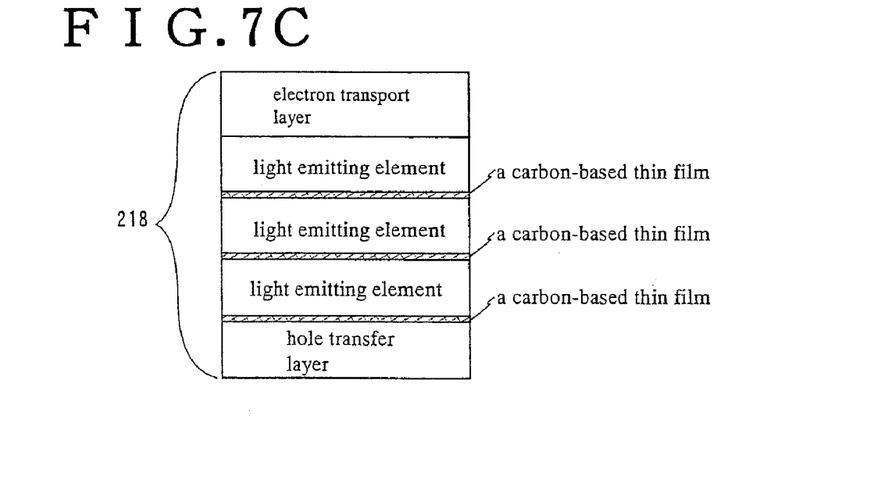
FIG. 7C is an extended cross sectional view of the EL layer.

The present example is shown in FIGS. 7A-C, in which a TFT is formed on a substrate having an insulating surface, followed by forming a light emitting element. In this example, furthermore, a cross sectional diagram of the TFT connected to the light emitting element in a pixel portion is shown.

At first, a primary insulating film 201 consisting of a laminated layer of insulating films such as a silicon oxide film, a silicon nitride film, or a silicon nitric oxide film is formed on a substrate 200 having an insulating surface. In this example, the primary insulating film 201 is of a two-layered structure. Alternatively, it may be provided as a single layered film formed of the above insulating film or a laminated structure prepared by laminating two or more layers. A first layer of the primary insulating film 201 is prepared as a silicon nitric oxide film having a thickness of 10 to 200 nm (preferably 50 to 100 nm), which is formed using a plasma CVD method and also using $SiH_4$, $NH_3$, and $N_2O$ as reaction gases. Specifically, in this example, a silicon nitric oxide film having a film thickness of 50 nm (percentage composition: Si=32%, O=27%, N=24%, H=17%) is formed. Besides, a second layer of the primary insulating film is laminated and fanned as a silicon nitric oxide film having a thickness of 50 to 200 nm (preferably 100 to 150 nm), which is formed using a plasma CVD method and also using $SiH_4$ and $N_2O$ as reaction gases. Specifically, in this example, a silicon nitric oxide film having a film thickness of 100 nm (percentage composition: Si=32%, O=59%, N=7%, H=2%) is formed.

Subsequently, a semiconductor layer is formed on the primary film. The semiconductor layer is formed by patterning a crystalline semiconductor film into a desired shape. In this example, the crystalline semiconductor film is obtained by forming a semiconductor film having an amorphous structure with well-known procedures (e.g., a sputtering method, a LPCVD method, or a plasma CVD method), followed by subjecting to a well-known processing for crystallization (e.g., a laser crystallization method, a thermal crystallization method, or a thermal crystallization method using a catalyst such as nickel). The semiconductor layer is formed so as to be 25 to 80 nm (preferably 30 to 60 nm) in thickness. The crystalline semiconductor film may be preferably prepared using a material, but not limited to, such as silicon or silicon-germanium alloy.

Furthermore, in the case of preparing a crystalline semiconductor film using a laser crystallization method, a pulse-oscillating or continuous luminescence type excimer laser, a YAG laser, or a $YVO_4$ laser can be used. In the case of using one of these lasers, it is preferable to use a method by which a laser beam radiated from a laser oscillator is linearly focused in an optical system to irradiate the beam on the semiconductor film. The conditions of crystallization may be properly selected by the operator. When the excimer laser is used, the conditions may include a pulse oscillation frequency of 30 Hz and a laser energy density of 100 to 400 $mJ/cm^2$ (typically 200 to 300 $mJ/cm^2$). When the YAG laser is used, alternatively, the conditions may include a pulse oscillation frequency of 1 to 10 kHz using a second harmonic and an laser energy density of 300 to 600 $mJ/cm^2$ (typically 350 to 500 $mJ/cm^2$). Besides, the laser beam linearly focused at width of 100 to 1000 μm, for example, 400 μm is irradiated over the whole surface of the substrate, while an overlap ratio of the linear laser beam at this time is 80 to 98%.

Subsequently, the surface of the semiconductor layer is washed with an etchant containing hydrofluoric acid to form a gate insulating film 202 that covers the semiconductor layer. The gate insulating film 202 is formed of a silicon-containing insulating film having a thickness of 40 to 150 nm using a plasma CVD method or a sputtering method. In this example, the gate insulating film 202 is formed of a silicon nitric oxide film (percentage composition: Si=32%, O=59%, N=7%, and H=2%) by a plasma CVD method. Here, the gate insulating film is not limited to the silicon nitric oxide film. Alternatively, other silicon-containing insulating film may be used as a single layer or a laminated structure of two or more layers.

After that, the surface of the gate insulating film 202 is washed, followed by forming a gate electrode 210.

Furthermore, a source region 211 and a drain region 212 are formed by an appropriate addition of an impurity element (e.g., Boron) for providing the semiconductor with P type. In this example, boron is properly added. After the addition, for activating the impurity element, heating treatment, strong light irradiation, or laser beam irradiation is performed. In addition, simultaneously with the activation, it is possible to recover the gate insulating film from plasma-caused damages and to recover the boundary between the gate insulating film and the semiconductor layer from plasma-caused damages. In particular, under atmospheric conditions of room temperature to 300° C., it is very effective to activate the impurity element by irradiating a second harmonic beam of YAG laser from the surface or back face. It is a preferable activating means because only a small amount of maintenance is required for the YAG laser.

In the following steps, an interlayer insulating film 213a made of an organic material or an inorganic material is formed, and after hydrogenation, a first protective film 213b is formed. The first protective film 213b may be formed of an aluminum nitride film, an aluminum nitric oxide film represented by $AlN_xO_y$, or a silicon nitride film. Here, the film represented by $AlN_XO_Y$ may be formed by a RF sputtering method using a target made of AlN or Al such that oxygen or nitrogen, or rare gas is introduced from the above gas-introducing system. In the film represented by $AlN_XO_Y$, the content of nitrogen may be in the range of several atm % or more, preferably in the range of 2.5 atm % to 47.5 atm %, and the content of oxygen may be in the range of 47.5 atm % or less, preferably 0.01 or more but less than 20 atm %. Besides, a contact hole extending to the source or drain region is formed, followed by completing TFT (p-channel type TFT) with the formation of a source electrode (wiring) 215 and a drain electrode 214. This TFT controls the current to be supplied to an organic light emitting device (OLED).

Subsequently, in the pixel portion, a first electrode 217 in contact with a connecting electrode in contact with the drain region is arranged in matrix shape. This first electrode 217 serves as an anode or a cathode of the light emitting element. Then, a insulator (generally referred to as a bank, a partition, a barrier, a mound, or the like) 216 that covers the end portion of the first electrode 217 is formed. For the insulator 216, a photosensitive organic resin is used. In the case of using a negative type photosensitive acrylic resin is used as a material of the insulator 216, for example, the insulator 216 may be preferably prepared such that the upper end portion of the insulator 216 has a curved surface having a first curvature radius and the lower end portion of the insulator has a curved surface having a second curvature radius. Each of the first and second curvature radiuses may be preferably in the range of 0.2 μm to 3 μm.

Furthermore, a layer 218 containing an organic compound is formed on the pixel portion, and a second electrode 219 is then formed thereon to complete a light emitting element. This second electrode 219 serves as a cathode or an anode of the light emitting element.

The insulator 216 that covers the end portion of the first electrode 217 may be covered with a second protective film formed of an aluminum nitride film, an aluminum nitric oxide film, or a silicon nitride film.

For instance, as shown in FIG. 7B, in the case of using a positive type photosensitive acrylic resin as a material of the insulator 316b, only the upper end of the insulator 316b has a curved surface having a curvature radius. In this case, furthermore, the insulator 316b is covered with a protective film 317a formed of an aluminum nitride film, an aluminum nitric oxide film, or a silicon nitride film.

In the present example, furthermore, a carbon-based thin film is provided between the light emitting layers in the layer 218 containing an organic compound. The configuration of such a structure is represented as an enlarged view in FIG. 7C.

Depending on the direction of irradiating light, it is considered that there are two different structures of the active matrix type light emitting device having TFT. One of them is a structure by which light emitted from the light emitting element is irradiated into the eyes of the observer after passing through the second electrode. In this case, the observer is allowed to recognize an image on the second electrode side. The other of them is a structure by which light emitted from the light emitting element is irradiated into the eyes of the observer after passing through the first electrode and the substrate.

For applying the structure by which light emitted from the light emitting element is irradiated into the eyes of the observer after passing through the second electrode, it is preferable to use a material having a translucency as a material of the second electrode 219.

For instance, when the first electrode 217 is used as an anode, the material of the first electrode 217 may be a metal (i.e., Pt, Cr, W, Ni, Zn, Sn, or In) having a large work function. The end portion of such an electrode 217 is covered with the insulator (generally referred to as a bank, a partition, a barrier, a mound, or the like) 216, and then a solution of poly(ethylenedioxythiophene)/poly(styrenesulfonate) is applied on the whole surface, followed by baking.

Subsequently, a DLC film is formed as a carbon-based thin film. The DLC film having a film thickness of 3 to 50 nm is prepared using a plasma CVD method (typically, a RF plasma CVD method, a microwave CVD method, an electron cyclotron resonance (ECR) CVD method, a hot-filament CVD method, or the like), a helicon wave plasma method, a combustion method, a sputtering method, an ion beam deposition method, a laser deposition method, or the like. In addition, it is important to prevent the film containing an organic compound from being damaged at the time of film formation.

Next, a polyvinylcarbazole (PVK) solution doped with luminescence center pigments (e.g., 1,4,4-tetraphenyl-1,3-butadiene (TPB), 4-didicyanomethylene-2-methyl-6-(p-dimethylamino-styryl)-4H-pyrane (DCM1), Nile Red, or coumarin 6) to be acted as a light emitting layer is applied on the whole surface of the DLC film, followed by baking.

Subsequently, the DLC film is formed.

Furthermore, the same light emitting layer as one described above is also formed and baked, followed by forming a second electrode 219 as a cathode. The second electrode 219 comprises a laminate structure of a metal (e.g., Li, Mg, or Cs) having a small work function; and a transparent conductive film (made of an indium tin oxide (ITO) alloy, an indium zinc oxide alloy ($In_2O_3$—ZnO), zinc oxide (ZnO), or the like) on the thin film. For attaining a low-resistance cathode, an auxiliary electrode may be provided on the insulator 216. The light emitting element thus obtained emits white luminescence. In addition, the DLC film is formed between the light emitting layers, so that there is no need to resolve at the time of applying PVK thereon. Here, the example in which the layer 218 containing the organic compound is formed by the application has been described. According to the present invention, however, it is not limited to a specific method and the layer 218 may be formed using a deposition method.

Furthermore, the example described above is of laminating organic compound layers. Alternatively, the organic compound layer may be provided as a single layer in stead of the laminate. For instance, electron-transferable 1,3,4-oxadiazole derivative (PBD) may be dispersed in hole-transferable polyvinyl carbazole (PVK). In addition, 30 wt % of PBD may be dispersed as an electron transferring agent, and also appropriate amounts of four pigments (TPB, coumarin 6, DCM 1, and Nile Red) may be dispersed to obtain white luminescence. Furthermore, a layer made of a high polymer material may be provided as an organic compound layer and laminated together with a layer made of a low molecular material.

Furthermore, in the case of using the structure by which light emitted from the light emitting element is irradiated into the eyes of the observer after passing through the first electrode, it is preferable that the first electrode 217 may be prepared using a material having a translucency.

For instance, when the first electrode 217 is provided as an anode, a transparent conductive film (made of an indium tin oxide (ITO) alloy, an indium zinc oxide alloy ($In_2O_3$—ZnO), zinc oxide (ZnO), or the like) is used for a material of the first electrode 217 and the end portion thereof is covered with the insulator (generally referred to as a bank, a partition, a barrier, a mound, or the like) 216, followed by forming the layer 218 containing an organic compound. On this layer, furthermore, a second electrode 219 formed of a metal film (i.e., an alloy of MgAg, MgIn, AlLi, $CaF_2$, CaN, or the like, or a film formed by a co-deposition of an element of Group I and Group II in the periodic table and aluminum) is formed as a cathode. Here, a resistive heating method using deposition is used for the formation of a cathode, so that the cathode can be selectively formed using a deposition mask.

After forming the second electrode 219 and so on by the steps described above, a sealing substrate 118 is laminated using a sealing agent 119 to seal the light emitting element formed on the substrate 200. For keeping a clearance between the sealing substrate 118 and the light emitting element, a spacer made of a resin film may be placed. In addition, the space on the inner side of the sealing agent 119 is filled with an inert gas such as nitrogen. Preferably, the sealing agent 119 may be an epoxy resin. Preferably, furthermore, the sealing agent 119 may be a material which has impermeable properties to oxygen and water as far as possible. In addition, an additional substance (e.g., a drying agent) having abilities of absorbing oxygen and water into the space may be contained.

Furthermore, as a constitutional material of the sealing substrate 118, in addition to a glass substrate or a quartz substrate, a plastic substrate made of a material such as fiberglass-reinforced plastics (FRP), polyvinylchloride (PVF), mylar, polyester, or acryl may be used. Furthermore, after adhering the sealing substrate 118 using the sealing agent 119, it is also possible to seal with the sealing agent so as to cover the side face (the exposed surface).

As described above, by sealing the light emitting element within the space described above, the light emitting element can be completely cut off from the outside. Therefore, it is possible to prevent the penetration of any substance such as water or oxygen that facilitates the deterioration of the organic compound layer from the outside. Consequently, the light emitting device having a high reliability can be obtained.

Figures 6A, 6B:
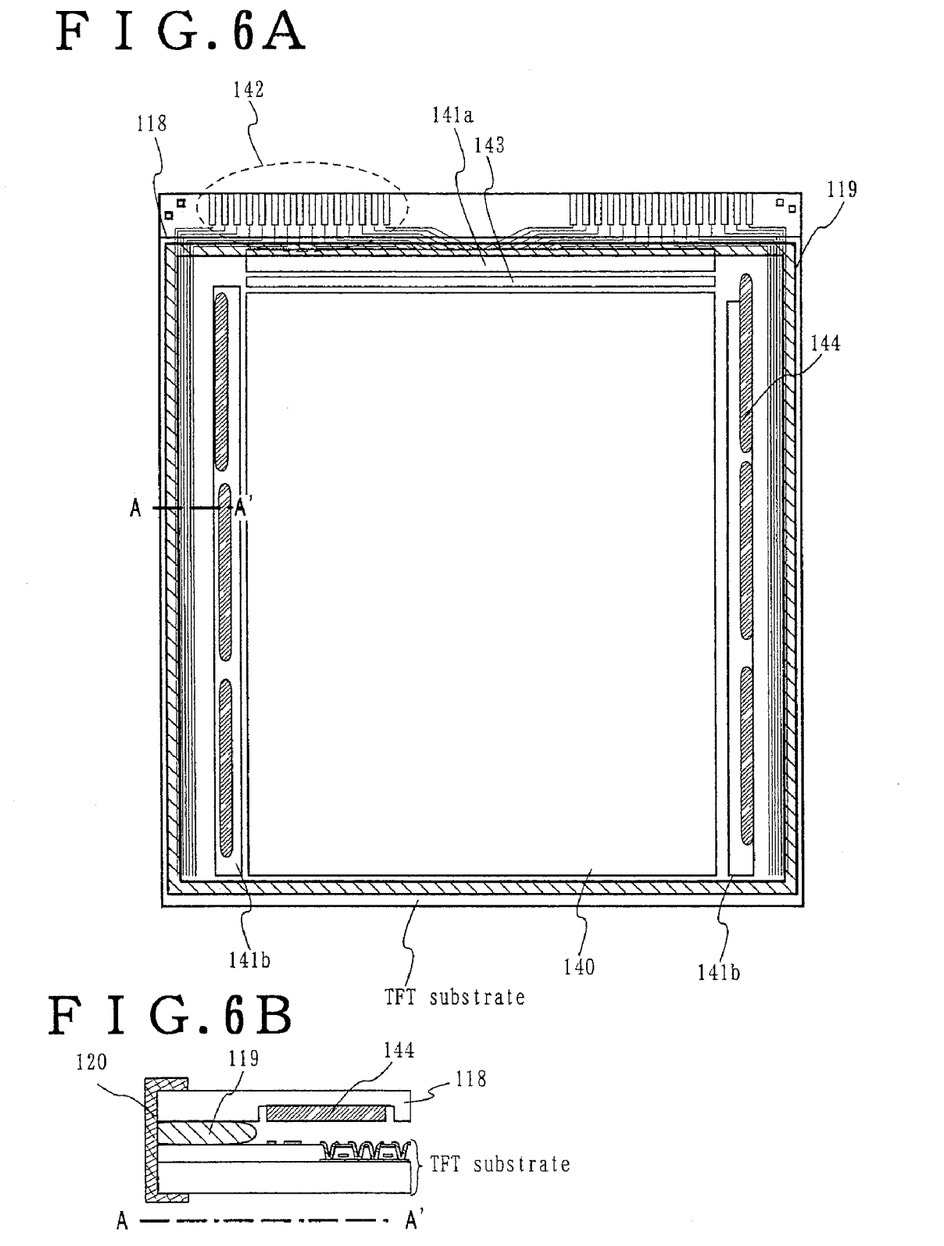
FIG. 6A is a top view and FIG. 6B is a cross sectional view along the line A-A' in FIG. 6A.

Referring now to FIGS. 6A-B, the entire configuration of the EL module and the arrangement of a drying agent will be described.

On a substrate having uncountable TFTs formed thereon (also referred to as a TFT substrate), there are a pixel portion 140 on which an image can be displayed, driving circuits 141a, 141b for driving each pixel in the pixel portion 140, a connecting portion for making a connection between leads and electrodes formed on the EL layer, terminals 142 on which FPC is laminated for making a connection with an external circuit, and a drying agent 144. In FIG. 6A, the drying agent 144 is arranged such that it overlaps part of the driving circuits 141a, 141b. Alternatively, the drying agent 144 may overlap the whole part of the driving circuits 141a, 141b. In addition, it can be hermetically sealed with the substrate for sealing the EL element and the sealing agent 119. Furthermore, FIG. 6B is a cross sectional diagram along the chained line A-A' in FIG. 6A. In FIG. 6B, a package 120 is also shown in the drawing.

Uncountable pixels are regularly arranged in the pixel portion 140 and they are arranged in the X direction in the order of R, G, and B (not shown).

In FIG. 6B, furthermore, the sealing substrate 118 is laminated with the sealing agent 119 to keep a clearance of about 2 to 30 μm as shown in FIG. 6B, so that all of the light emitting elements are enclosed in the space. Recessed portions are formed in the sealing substrate 118 by a sand blast method so that the drying agents are placed in these recessed portions. Preferably, the sealing agent 119 may have a narrowed edge so as to be overlapped with a part of the driving circuit. Just before laminating the sealing substrate 118 with the sealing agent 119, it is preferable to deaerate by annealing in a vacuum. Furthermore, at the time of laminating the sealing substrate 118, it is preferable to laminate in an atmosphere including an inert gas (rare gas or nitrogen).

The present example may be freely combined with one of Embodiments 1 to 3.

Example 2

By implementing the present invention, all of electronic equipment into which modules having an OLED (such as an active matrix EL module) are built can be completed.

Following can be given as such electronic equipment: video cameras; digital cameras; head mounted displays (goggle type displays); car navigation systems; projectors; car stereos; personal computers; electronic game machines; portable information terminals (mobile computers, mobile phones or electronic books etc.) etc. Examples of these are shown in FIGS. 8A to 8F and 9A to 9C.

Figures 8A, 8B:
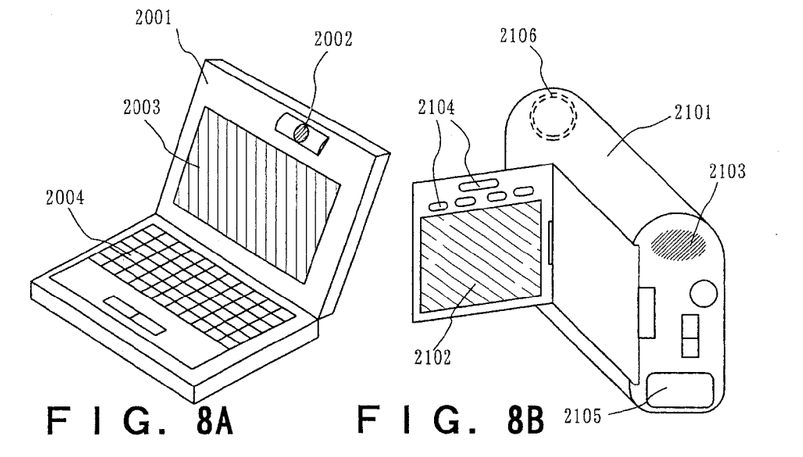
FIGS. 8A-F are diagrams for illustrating various kinds of electronic devices on which the present invention is applicable, where FIGS. 8A to 8F schematically show different electronic devices, respectively.

FIG. 8A is a personal computer which comprises: a main body 2001; an image input section 2002; a display section 2003; and a keyboard 2004 etc.

FIG. 8B is a video camera which comprises: a main body 2101; a display section 2102; a voice input section 2103; operation switches 2104; a battery 2105 and an image receiving section 2106 etc.

Figure 8C:
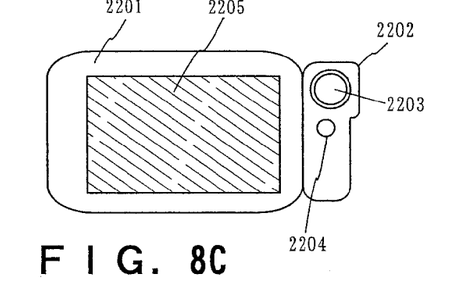

FIG. 8C is a mobile computer which comprises: a main body 2201; a camera section 2202; an image receiving section 2203; operation switches 2204 and a display section 2205 etc.

Figure 8D:
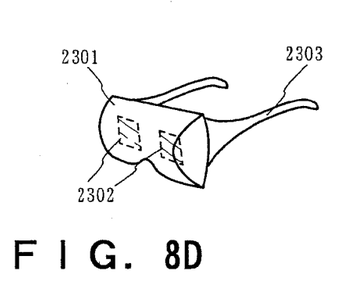

FIG. 8D is a goggle type display which comprises: a main body 2301; a display section 2302; and an arm section 2303 etc.

Figure 8E:
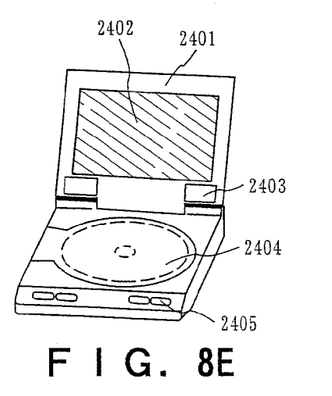

FIG. 8E is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (digital versatile disc), CD, etc. for the recording medium, and can perform music appreciation, film appreciation, games and use for Internet.

Figure 8F:
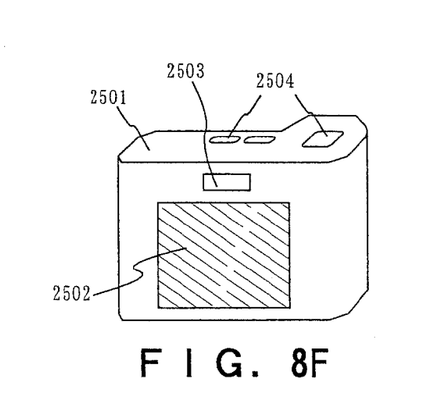

FIG. 8F is a digital camera which comprises: a main body 2501; a display section 2502; a view finder 2503; operation switches 2504; and an image receiving section (not shown in the figure) etc.

Figure 9A:
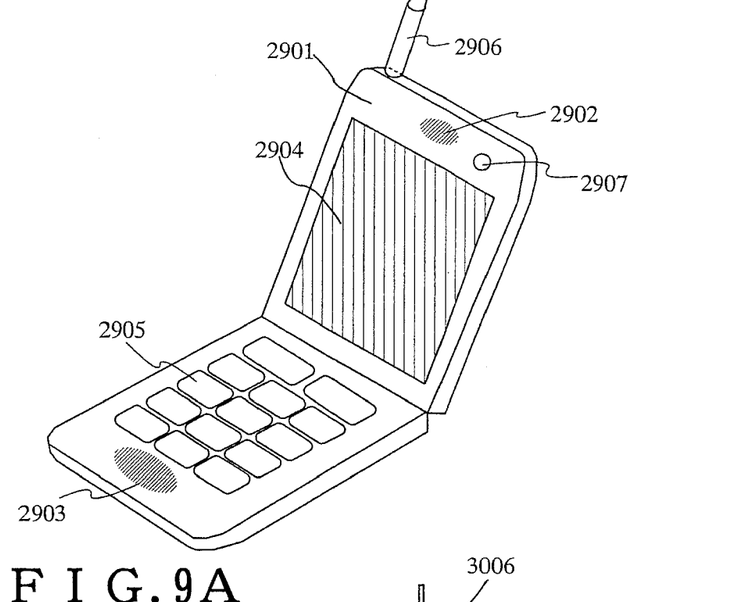
FIGS. 9A-C are diagrams for illustrating various kinds of electronic devices on which the present invention is applicable, where FIGS. 9A to 9C schematically show different electronic devices, respectively.

FIG. 9A is a mobile phone which comprises: a main body 2901; a voice output section 2902; a voice input section 2903; a display section 2904; operation switches 2905; an antenna 2906; and an image input section (CCD, image sensor, etc.) 2907 etc.

Figure 9B:
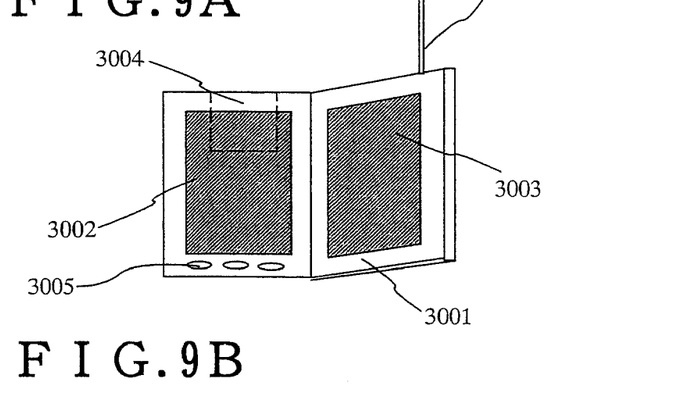

FIG. 9B is a portable book (electronic book) which comprises: a main body 3001; display sections 3002 and 3003; a recording medium 3004; operation switches 3005 and an antenna 3006 etc.

Figure 9C:
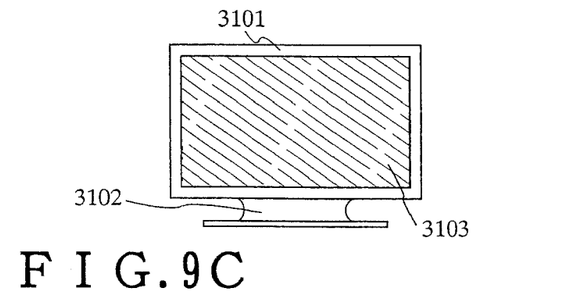

FIG. 9C is a display which comprises: a main body 3101; a supporting section 3102; and a display section 3103 etc.

In addition, the display shown in FIG. 9C has small and medium-sized or large-sized screen, for example a size of 5 to 20 inches. Further, to manufacture the display part with such sizes, it is preferable to mass-produce by gang printing by using a substrate with one meter on a side.

As described above, the applicable range of the present invention is extremely large, and the invention can be applied to electronic equipment of various areas. Note that the electronic devices of this example can be achieved by utilizing any combination of constitutions in Embodiments 1 to 4, and Example 1.

According to the present invention, the light emitting element having an organic compound is capable of effectively removing or decreasing heat, so that the light emitting element can be prevented from thermal deterioration to increase the reliability.

What is claimed is:

1. A light emitting device comprising:
    a light emitting element comprising:
        a first electrode;
        a first light emitting layer over the first electrode;
        a carbon-based film over the first light emitting layer;
        a second light emitting layer over the carbon-based film; and
        a second electrode over the second light emitting layer;
    wherein the carbon-based film is in contact with the first light emitting layer and the second light emitting layer, and
    wherein the carbon-based film has a visible light transmittance of 50 to 100%.

2. A light emitting device according to claim 1, wherein the carbon-based film has larger band gap than the first light emitting layer and the second light emitting layer.

3. A light emitting device according to claim 1, wherein the first electrode and the second electrode are arranged such that an electron passes through the carbon-based film by applying a voltage between the first electrode and the second electrode.

4. A light emitting device according to claim 1, wherein the carbon-based film is an insulator or diamond like carbon.

5. A light emitting device according to claim 1, wherein the carbon-based film is a potential barrier.

6. A light emitting device according to claim 1, further comprising a carbon-based film between the second light emitting layer and the second electrode.

7. A light emitting device according to claim 1, further comprising a carbon-based film between the first light emitting layer and the first electrode.

8. A light emitting device according to claim 1, wherein the light emitting device is a passive matrix electroluminescence display device.

9. A light emitting device according to claim 1, wherein each of the first light emitting layer and the second light emitting layer includes an organic material.

10. A light emitting device according to claim 1, further comprising a color filter over the second electrode, the color filter and the light emitting element overlap with each other, wherein the light emitting element emits white light.

11. A light emitting device comprising:
    a light emitting element comprising:
        a first electrode;
        a first light emitting layer over the first electrode;
        a carbon-based film over the first light emitting layer;
        a second light emitting layer over the carbon-based film; and
        a second electrode over the second light emitting layer; and
    a color filter, the color filter and the light emitting element overlap with each other,
    wherein the carbon-based film is in contact with the first light emitting layer and the second light emitting layer, and
    wherein the light emitting element emits white light.

12. A light emitting device according to claim 11, wherein the carbon-based film has larger band gap than the first light emitting layer and the second light emitting layer.

13. A light emitting device according to claim 11, wherein the first electrode and the second electrode are arranged such that an electron passes through the carbon-based film by applying a voltage between the first electrode and the second electrode.

14. A light emitting device according to claim 11, wherein the carbon-based film is an insulator or diamond like carbon.

15. A light emitting device according to claim 11, wherein the carbon-based film is a potential barrier.

16. A light emitting device according to claim 11, further comprising a carbon-based film between the second light emitting layer and the second electrode.

17. A light emitting device according to claim 11, further comprising a carbon-based film between the first light emitting layer and the first electrode.

18. A light emitting device according to claim 11, wherein the light emitting device is a passive matrix electroluminescence display device.

19. A light emitting device according to claim 11, wherein each of the first light emitting layer and the second light emitting layer includes an organic material.

20. A light emitting device according to claim 11, wherein the carbon-based film has a visible light transmittance of 50 to 100%.

* * * * *